United States Patent
Van Brocklin et al.

(10) Patent No.: US 6,534,841 B1
(45) Date of Patent: Mar. 18, 2003

(54) CONTINUOUS ANTIFUSE MATERIAL IN MEMORY STRUCTURE

(75) Inventors: Andrew L. Van Brocklin, Corvallis, OR (US); Kenneth J. Eldredge, Boise, ID (US); S. Jonathan Wang, Albany, OR (US); Frederick A Perner, Palo Alto, CA (US); Peter Fricke, Corvallis, OR (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 10/017,567

(22) Filed: Dec. 14, 2001

(51) Int. Cl.[7] ............................................... H01L 29/00
(52) U.S. Cl. .......................... 257/530; 257/50; 438/129
(58) Field of Search .................. 257/50, 530; 438/129, 438/130

(56) References Cited

U.S. PATENT DOCUMENTS

| | | | |
|---|---|---|---|
| 5,543,656 A | * 8/1996 | Yen et al. .................... | 257/530 |
| 5,625,220 A | 4/1997 | Liu et al. .................... | 257/530 |
| 5,835,396 A | 11/1998 | Zhang .......................... | 365/51 |
| 5,926,415 A | 7/1999 | Shin ....................... | 365/185.17 |
| 6,002,607 A | 12/1999 | Dvir ........................... | 365/103 |
| 6,034,882 A | 3/2000 | Johnson et al. ............. | 365/103 |
| 6,185,121 B1 | 2/2001 | O'Neill ........................ | 365/94 |
| 6,185,122 B1 | 2/2001 | Johnson et al. ............. | 365/103 |
| 6,434,060 B1 | * 8/2002 | Tran et al. ............. | 365/198.07 |
| 2001/0055838 A1 | * 12/2001 | Walker et al. .............. | 438/129 |
| 2002/0079553 A1 | * 6/2002 | Cleeves ..................... | 257/530 |

* cited by examiner

*Primary Examiner*—Richard Elms
*Assistant Examiner*—Brad Smith

(57) ABSTRACT

A memory structure has an antifuse material that is unpatterned and sandwiched between each of a plurality of antifuse electrode pairs. The antifuse material is continuous between the antifuse electrode pairs. Furthermore the present invention includes a memory structure comprising a plurality of antifuse electrode pairs forming a plurality of row conductors and a plurality of middle conductors in electrical communication with a plurality of control elements.

18 Claims, 9 Drawing Sheets

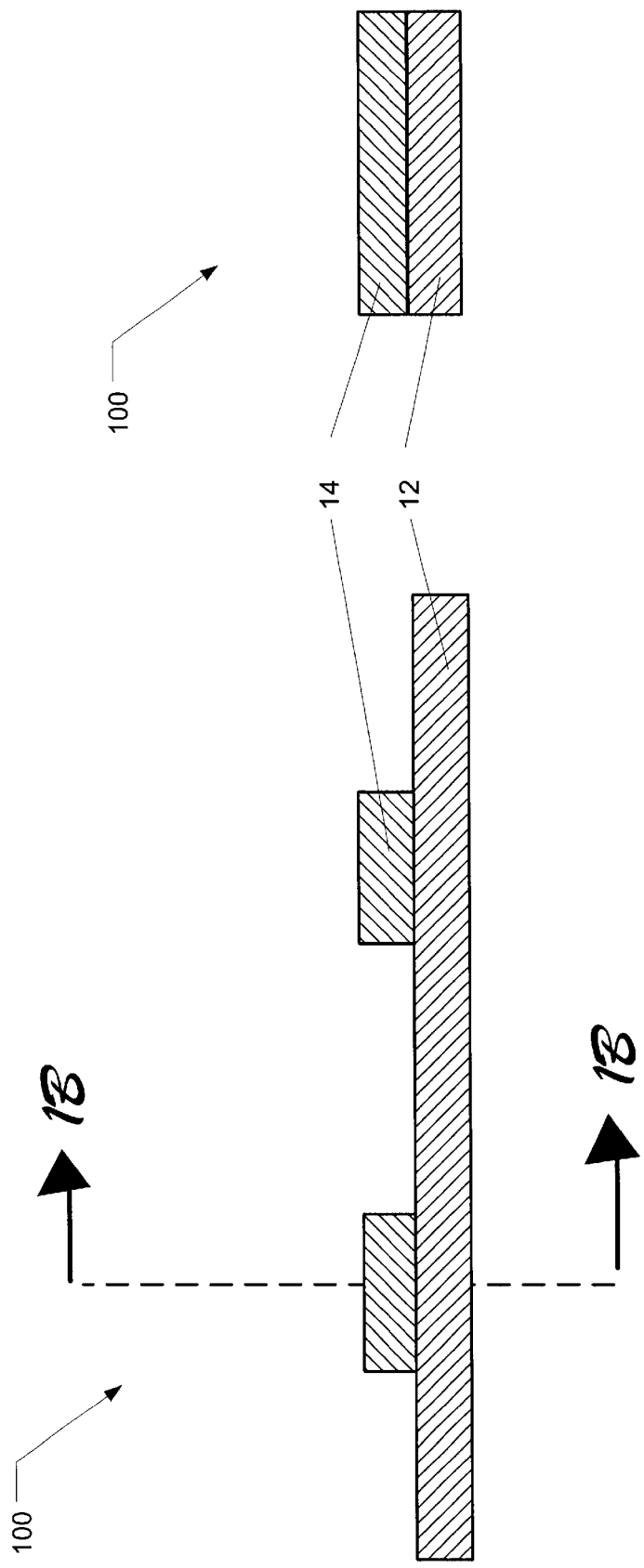

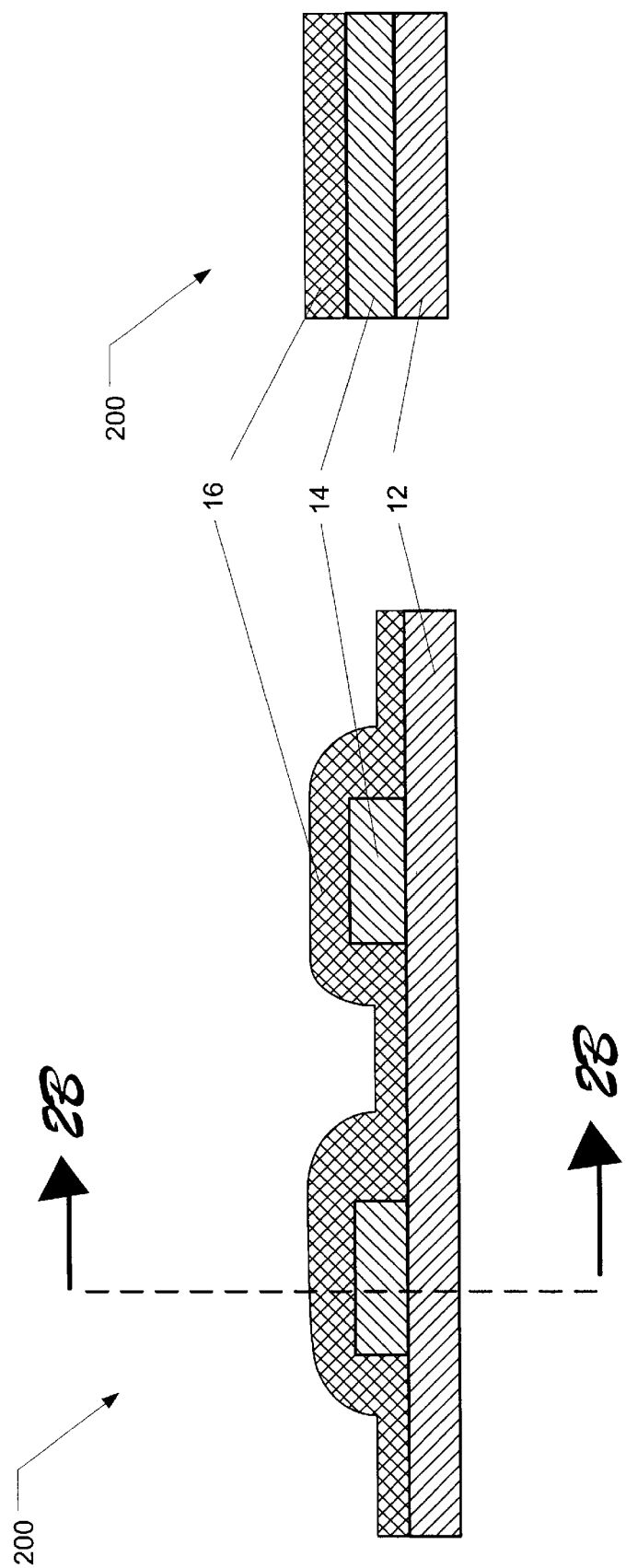

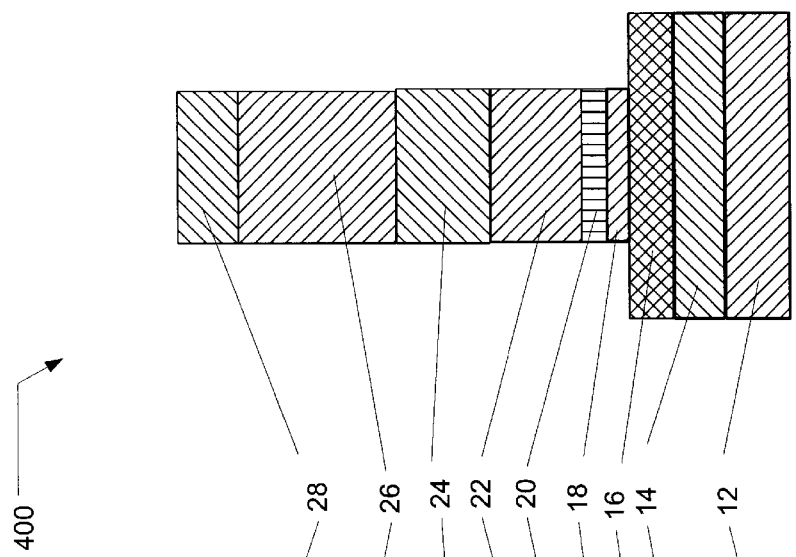
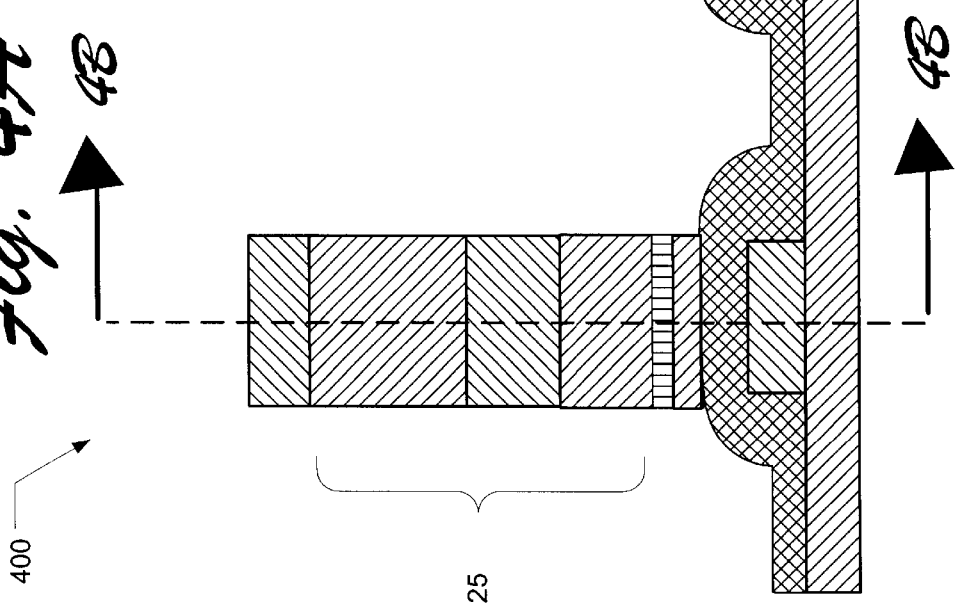

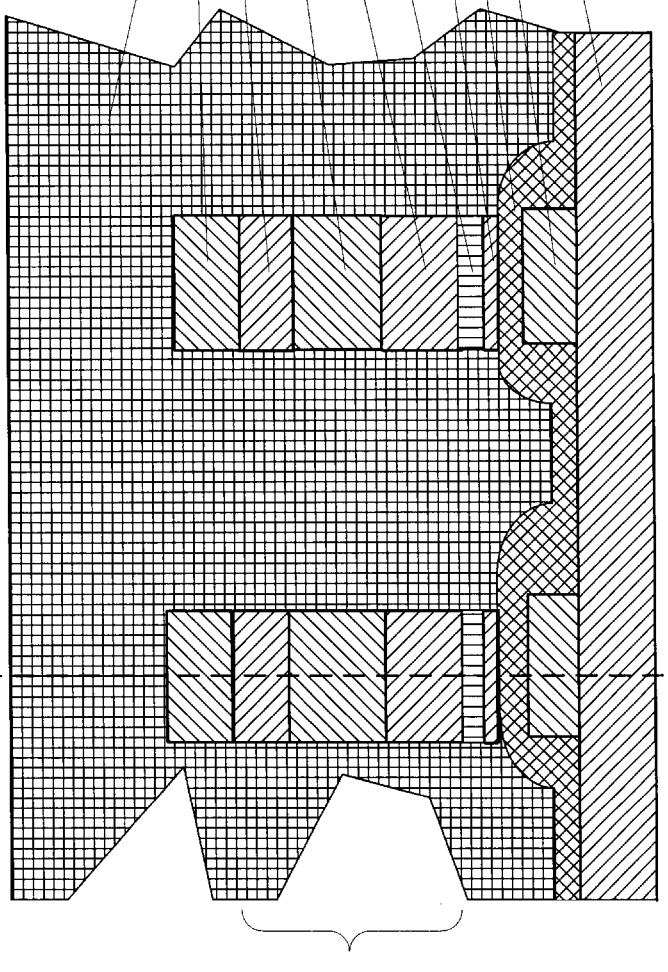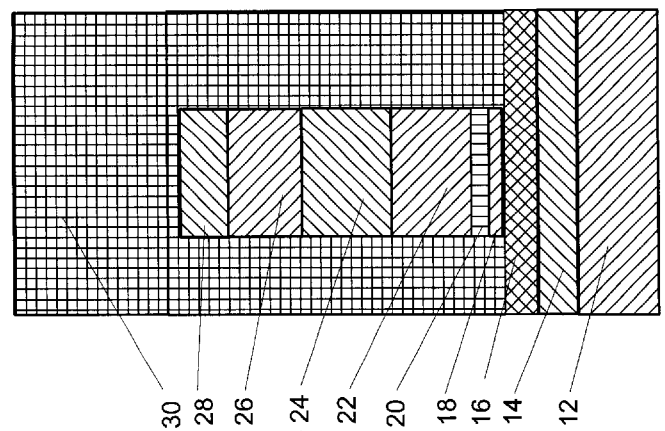

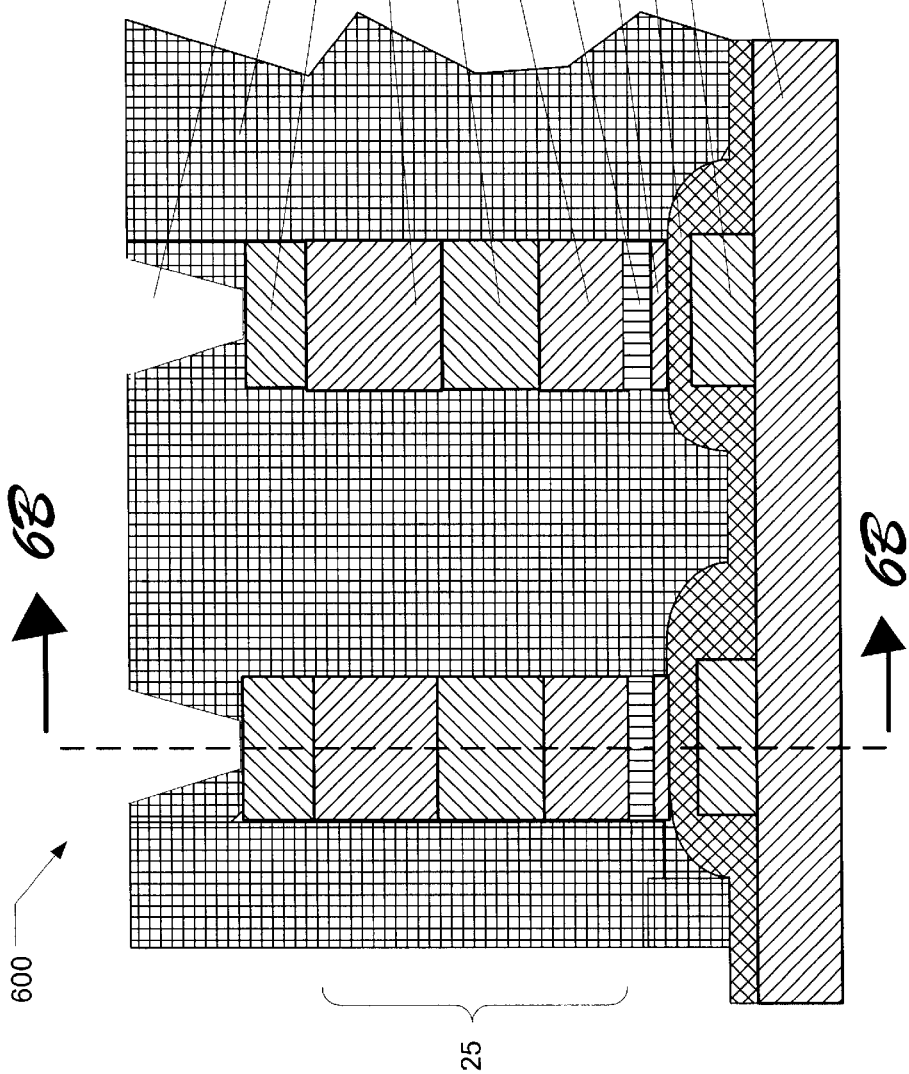
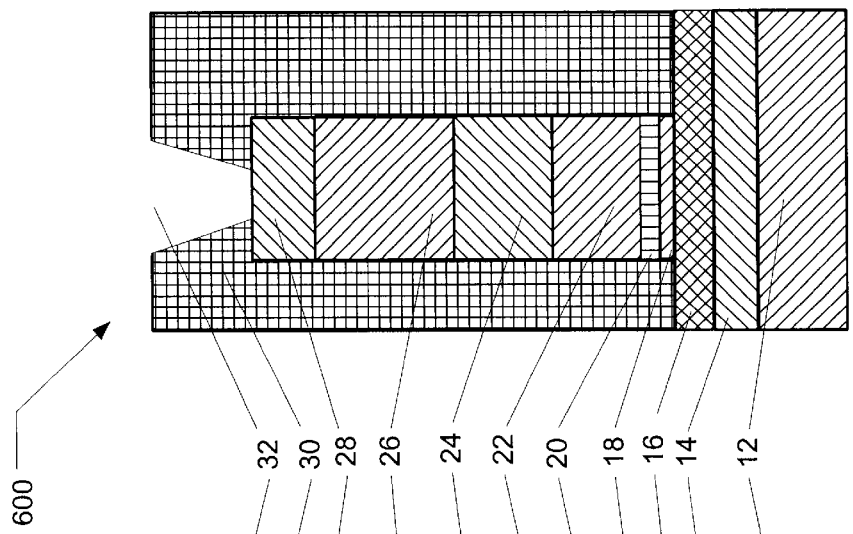

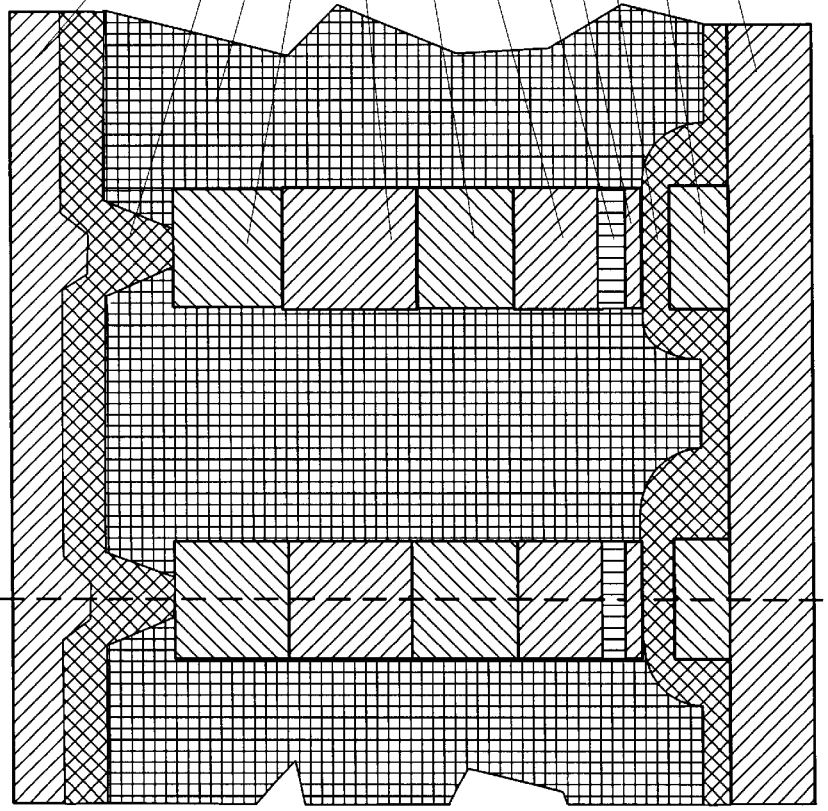
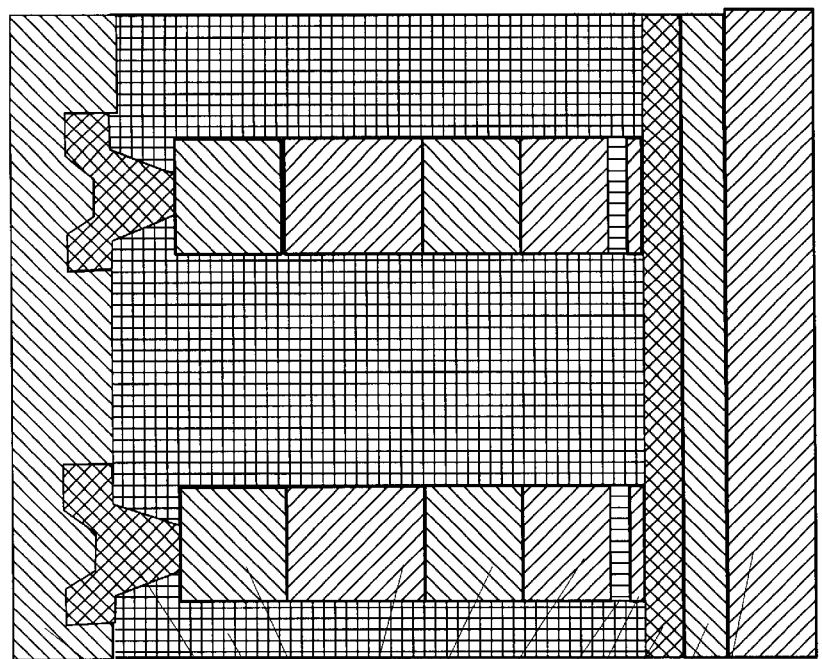
Fig. 7A
Fig. 7B

CONTINUOUS ANTIFUSE MATERIAL IN MEMORY STRUCTURE

FIELD OF THE INVENTION

The present invention relates to memory structures, and is more particularly related to fabrication of an antifuse material in a memory structure.

BACKGROUND OF THE INVENTION

An antifuse structure can include a material which initially has a high resistance but which can be converted into a low resistance material by the application of a programming voltage. The programming voltage is in excess of a breakdown voltage of the high resistance material. The high resistance material is an electrically insulating antifuse layer which is sandwiched between a pair of electrically conductive layers. Each electrically conductive layer in the pair is generally considered an antifuse electrode of the antifuse structure. The high resistance material, also called an antifuse material or an antifuse layer, is non-conductive when manufactured but is caused to become permanently conductive by application of the programming voltage across the pair of electrically conductive layers.

When a programming current is applied through the antifuse layer across the pair of electrically conductive layers, an electrically conductive filament forms in the antifuse layer. The newly formed electrically conductive filament in the antifuse layer, which can be as narrow as several atoms in width, is effective as an electrical short of the two electrically conductive layers, thus programming the antifuse structure. Those antifuse structures that remain unprogrammed have no electrically conductive filament connecting their respective pair of electrically conductive layers.

Antifuse structures that are used in memory structures can be fabricated by integrated circuit technology. This fabrication can be directed to certain classes of IC chips such as field programmable gate arrays (FPGAs), programmable read-only memories (PROMs) and the like. FPGAs typically include a large number of logic elements, such as AND gates and OR gates, which can be selectively coupled to perform user designed functions. Programming a FPGA is generally accomplished by applying a programming voltage to selected antifuse structures thereby converting them into conductive interconnections.

During fabrication of an antifuse structure, the high resistance antifuse material serves the purpose of preventing unwanted electrical shorts from occurring between respective antifuse electrodes. This electrical insulation function of the antifuse material can be compromised in the fabrication process. The compromise can occur when patterning the antifuse material to form relatively short antifuse material segments across a wafer. Misaligned patterning of the antifuse material can result in antifuse electrodes in antifuse structures that make contact one with the other, and thus having an undesired electrical short. Misalignment can occur as design dimensions and process windows are subjected to increasingly higher scale integration in semiconductor die fabrication, such as where photolithographic resolution limits are approached.

When an unwanted short in an antifuse structure occurs, such as with a defect created during manufacturing, another antifuse structure must be used in place of the shorted antifuse structure. Even if redundancy is designed into memory structures, excessive electrical shorts cause non-functional memory cells, reduced fabrication yield, and increased costs to fabricate the memory structures. As such, it would be an advance in the art to reduce the incidence of unwanted electrical shorts between respective antifuse electrodes in antifuse structures during fabrication of memory structures.

It is desirable to fabricate memory structures with as few process steps and in as short of time in a clean room environment as practical. Short processing time in the clean room environment is desirable because operation and maintenance of the clean room environment for antifuse memory cell fabrication using semiconductor technology processes is time consuming and expensive. Fewer process steps in memory structure fabrication are desirable because each fabrication process step is both an expense and an opportunity to reduce yield. As such, it would be an advance in the art to reduce the time and processing required to fabricate memory structures.

SUMMARY OF THE INVENTION

In one embodiment, a memory structure has an antifuse material that is unpatterned and sandwiched between each of a plurality of antifuse electrode pairs. The antifuse material is continuous between the antifuse electrode pairs.

These and other features of the present invention will become more fully apparent from the following description and appended claims, or may be learned by the practice of the invention as set forth hereinafter.

DESCRIPTION OF THE DRAWINGS

To further clarify the above and other advantages and features of the present invention, a more particular description of the invention will be rendered by reference to specific embodiments thereof which are illustrated in the appended drawings. The same numbers are used throughout the drawings to reference like features and components. It is appreciated that these drawings depict only typical embodiments of the invention and are therefore not to be considered limiting of its scope. The invention will be described and explained with additional specificity and detail through the use of the accompanying drawings in which:

FIG. 1A is a cross-sectional view of an implementation of the disclosed invention in which integrated circuit wafer fabrication materials and processes are used in the manufacture of antifuse structures for memory structures in which die are fabricated.

FIG. 1B is a cross-sectional view of the structure seen in FIG. 1A taken along the 1B—1B section line.

FIG. 2A is a cross-sectional view of the structure seen in FIG. 1A after further processing.

FIG. 2B is a cross-sectional view of the structure seen in FIG. 2A taken along the 2B—2B section line.

FIG. 4A is a cross-sectional view of the structure seen in FIG. 3A after further processing.

FIG. 4B is a cross-sectional view of the structure seen in FIG. 4A taken along the 4B—4B section line.

FIG. 5A is a cross-sectional view of the structure seen in FIG. 4A after further processing.

FIG. 5B is a cross-sectional view of the structure seen in FIG. 5A taken along the 5B—5B section line.

FIG. 6A is a cross-sectional view of the structure seen in FIG. 5A after further processing.

FIG. 6B is a cross-sectional view of the structure seen in FIG. 6A taken along the 6B—6B section line.

FIG. 7A is a cross-sectional view of the structure seen in FIG. 6A after further processing.

FIG. 7B is a cross-sectional view of the structure seen in FIG. 7A taken along the 7B—7B section line.

DETAILED DESCRIPTION

Figure 8B:
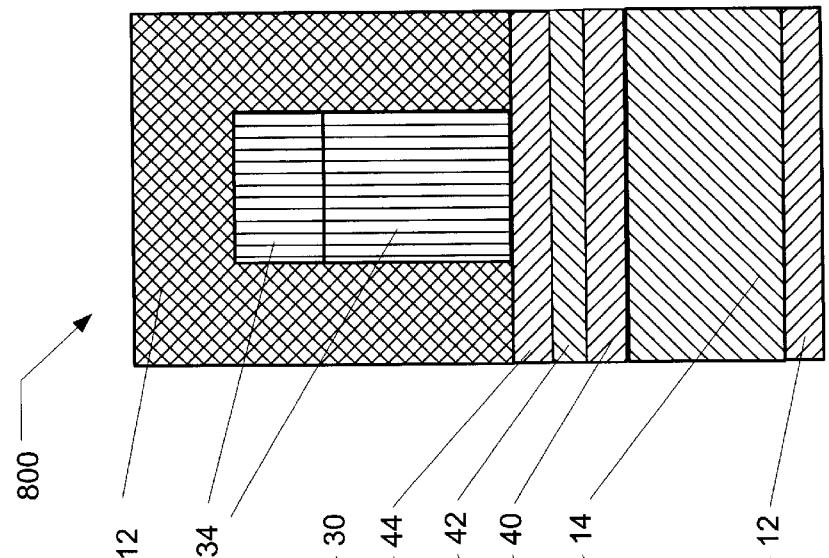
FIG. 8B is a cross-sectional view of the structure seen in FIG. 8A taken along the 8B—8B section line.
Figure 8A:
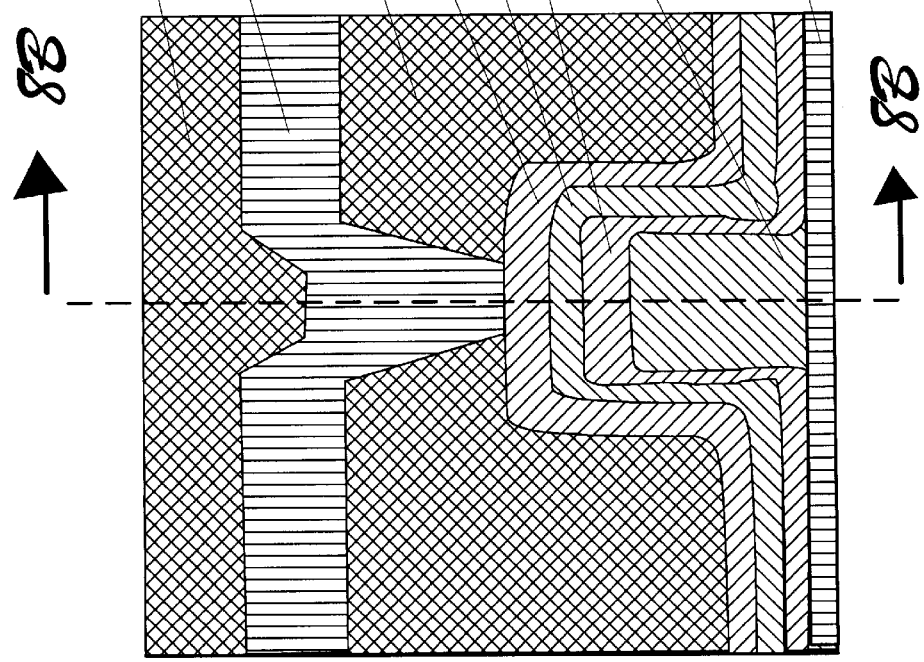
FIG. 8A is a cross-sectional view of another implementation of the disclosed invention in which integrated circuit wafer fabrication materials and processes are used in the manufacture of a memory structure in which a tunnel junction control element is upon an antifuse structure.

FIGS. 1A through 7B illustrate some of the processing steps for an embodiment of the present invention in which there are fabricated antifuse structures for use in memory structures. The memory structure comprises an antifuse structure and a control element. In FIGS. 1A through 7B, the control element is represented as being a PIN diode. In FIGS. 8A and 8B, the control element is represented as being a tunnel junction. In FIG. 1A, a structure 100 includes an interlayer dielectric (ILD) 12. ILD 12 is preferably composed of an electrical insulator material that includes but is not limited to a wet or dry silicon dioxide ($SiO_2$), a nitride material including silicon nitride, tetraethylorthosilicate ($Si-OC_2H_5)_4$) (TEOS) based oxides, borophosphosilicate glass (BPSG), phosphosilicate glass (PSG), borosilicate glass (BSG), oxide-nitride-oxide (ONO), polyamide film, tantalum pentoxide ($Ta_2O_5$), plasma enhanced silicon nitride (P—$SiN_x$), titanium oxide, oxynitride, germanium oxide, a spin on glass (SOG), any chemical vapor deposited (CVD) dielectric including a deposited oxide, a grown oxide, and/or like dielectric materials. ILD 12, when composed of TEOS based oxides, can be formed by a deposition resulting from the decomposition of a TEOS gas in a reactor. Planarization is a preferred process step after ILD 12 has been deposited and before the deposition and definition of row conductors 14, described below.

A plurality of electrically conductive row conductors 14 are formed upon ILD 12. Each row conductor 14 can be a word line for a memory structure and will preferably have a thickness in a range from about 200 Angstroms to about 18000 Angstroms, and most preferably about 3600 Angstroms. The composition of the electrically conductive material of row conductor 14 can be a metal such as aluminum, copper, or an aluminum-copper alloy, and can also be composed of amorphous silicon or microcrystalline silicon. Electrically conductive silicides, such as refractory metal silicides, are also contemplated as the electrically conductive material for row conductor 14.

FIGS. 2A–2B show a structure 200 that is the result of further processing operations upon structure 100 seen in FIGS. 1A–1B. Structure 200 depicts an antifuse layer 16 that is conformally formed upon ILD 12 and upon each row conductor 14. Low-pressure chemical vapor deposition (LPCVD) is preferred to form antifuse layer 16 in that good step coverage can be achieved over the underlying row conductors 14. Antifuse layer 16 can be formed by a deposition, will preferably have a thickness in a range from about 6 Angstroms to about 30 Angstroms, and will be composed of a high resistance material that can be converted into a low resistance material by the application of a programming voltage that induces a state change in antifuse layer 16. Antifuse layer 16 can be composed of a deposited oxide or a material that is oxidized in an oxidation process after it is deposited over underlying row conductors 14. Antifuse layer 16 can be formed as two layers, one of which is a resistive layer and other of which is a diffusion layer. The resistive layer can be a tunnel junction layer, an electrical insulation layer, or a high resistance layer. The diffusion layer is a conductor layer comprising a material that will easily diffuse through the antifuse layer when a programming voltage and current are applied so as to form a high resistance material. The high resistance material becomes a tunnel junction layer that serves as the antifuse material in the antifuse structure. When the antifuse material is to be formed from a deposited aluminum, antifuse layer 16 will be formed by a blanket oxidation of the deposited aluminum to form alumina (e.g. $Al_2O_3$). Antifuse layer 16 will preferably be deposited in a thickness in a range from about 6 Angstroms to about 30 Angstroms, and most preferably about 15 Angstroms.

Figures 3A, 3B:
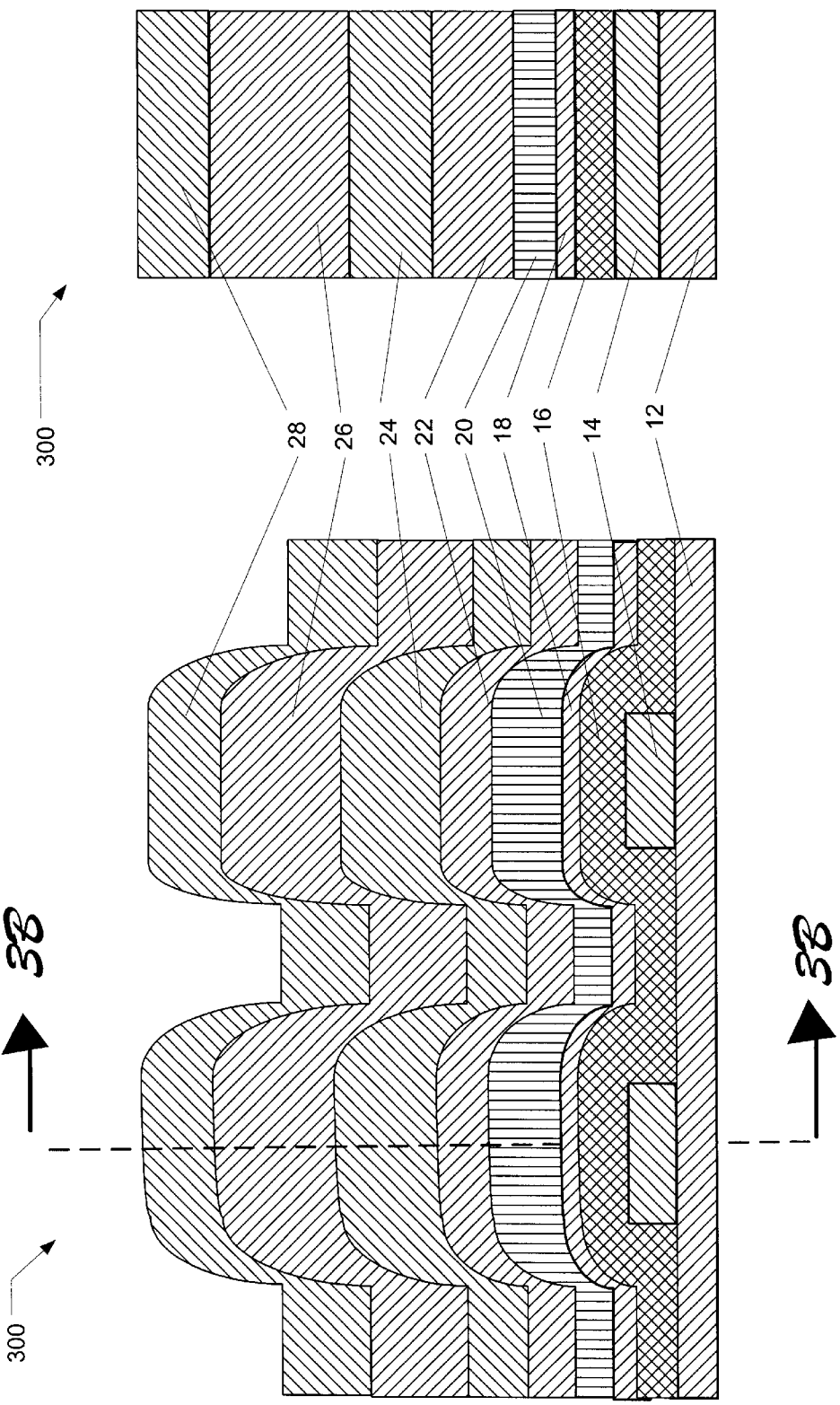
FIG. 3A is a cross-sectional view of the structure seen in FIG. 2A after further processing.
FIG. 3B is a cross-sectional view of the structure seen in FIG. 3A taken along the 3B—3B section line.

FIGS. 3A–3B show a structure 300 that is the result of further processing operations upon structure 200 seen in FIGS. 2A–2B. Structure 300 depicts a number of materials that have been conformably formed over antifuse layer 16. These materials include an optional first diffusion barrier 18, an optional interface metal 20, a p-doped region 22, an intrinsic or lightly doped region 24, an n-doped region 26, and an optional second diffusion barrier 28.

Optional first diffusion barrier 18 can be formed by low-pressure chemical vapor deposition and will preferably be electrically conductive and capable of withstanding the intended current density of the memory structures. Each such optional first diffusion barrier 18 will preferably be composed of an electrically conductive refractory metal or an alloy thereof, such as tungsten or tantalum, their suicides or nitrides. Alternatively, first diffusion barrier 18 can be entirely omitted. Optional interface metal 20 can be a noble metal or an alloy thereof such as platinum. Other materials for interface metal 20 include aluminum, gold, tantalum, and tungsten.

P-doped region 22, lightly doped region 24, and n-doped region 26 are preferably composed of a semiconductor material that can be deposited in a single deposition operation with altering or ramped dopants introduced during the deposition. The semiconductor material can be silicon, such as amorphous silicon or microcrystalline silicon. Alternatively, laser recrystallization can be used to form polysilicon from an initial deposition of amorphous silicon. In another embodiment, the doping of p-doped region 22 and n-doped region 26 can be reversed. Optional second diffusion barrier 28 can be composed of the same material as optional first diffusion barrier 18 that is upon antifuse layer 16.

FIGS. 4A–4B show a structure 400 that is the result of further processing operations upon structure 300 seen in FIGS. 3A–3B. Structure 400 depicts the results of a patterning process that defines a plurality of vertical stacks each of which projects from antifuse layer 16. The patterning process depicted in FIGS. 4A–4B can be performed by photolithographic and etch processing, the latter being selective to the material of which antifuse layer 16 is composed. Each vertical stack can be formed by several depositions of respective materials of the vertical stacks, followed by an anisotropic etch process of one or more etch recipes so as to form the depicted vertical stacks. Those of skill in the relevant semiconductor fabrication arts, by using the present disclosure as a guide, will recognize other processes and materials which could be used to fabricate the depicted and functionally equivalent structures.

While the various materials overlying antifuse 16 are patterned into the depicted vertical stacks, antifuse layer 16 remains unpatterned. In the event that a misalignment of patterning process, it is advantageous to leave antifuse layer 16 unpatterned because each p-doped region 22 will not electrically short out to its respective underlying row conductor 14. The continuous presence of antifuse layer 16 between opposing electrodes during fabrication effectively reduces electrical shorts, increases yields, and is less costly because an extra step to pattern antifuse layer 16 is not necessary.

FIG. 4B shows that p-doped region 22, lightly doped region 24, and n-doped region 26 form a diode 25. Diode 25 will have a preferred thickness in a range from about 150 Angstroms to about 2400 Angstroms, and most preferably about 1000 Angstroms. Diode 25 can be used as a control element, such as a steering element, in a memory structure to ascertain a charge stored in antifuse layer 16 in the memory structure. In use, antifuse layer 16 is made to be permanently conductive by application of a programming voltage across respective one of optional first diffusion barrier 18 and row conductor 14.

FIGS. 5A–5B depict an electrically insulative fill 30 that has been is formed upon unpatterned antifuse layer 16 and over the vertical stacks that are upon unpatterned antifuse layer 16. Fill 30 can be composed of any of the materials that underlying ILD 12 can be composed of. In FIGS. 6A–6B, a via or recess 32 is formed in fill 30 to expose a top surface on second diffusion barrier 28. In FIGS. 7A–7B, a column conductor 34 is formed within the vias 32 in contact with and upon optional second diffusion barrier 28. When second diffusion barrier 28 is not present, column conductor 34 is upon n-doped region 26. Column conductor 34 is composed of an electrically conductive material that can be the same as the material of which row conductors 14 are composed. Column conductor 34 can be formed by using two different materials, such as a contact in recess 32 which can be composed of a refractory metal such as tungsten or an alloy thereof, followed by an overlying column metal such as aluminum. Alternatively, column conductor 34 can be formed by blanket depositing a single electrically conductive material and then patterning the same to form individual column conductors 34 seen in FIG. 7B. Each column conductor 34 will be a bit line for a memory structure. After column conductor 34 is defined by patterning, another ILD 12 is formed upon column conductor 34.

FIGS. 7A–7B show a memory structure 700 which can be functionally described as a plurality of antifuse electrode pairs. An antifuse material, seen in at reference numeral 16, is continuous between each of the antifuse electrode pairs. Antifuse material 16 is sandwiched between each antifuse electrode pair. Memory structure 700 illustrates antifuse material 16 are being unpatterned. By avoiding a patterning process for antifuse material 16, fabrication time and costs are avoided.

In FIGS. 8A–8B, a memory structure 800 is an embodiment of the invention in which a tunnel junction is used as a control element. Memory element 800 comprises two components, namely, a tunnel junction and an antifuse. The tunnel junction is made up of an insulator between two conductors. As seen in memory structure 800, the tunnel junction is made up of the structures 34, 44, and 42, and the antifuse is made up of the structures 14, 40, and 42. The insulator of the tunnel junction is seen in memory structure 800 as a control element 44, and the two conductors of the tunnel junctions, respectively, are a column conductor 34 and a middle terminal 42. The antifuse is made up of row conductor 14, antifuse dielectric 40, and middle terminal 42. As can be seen in memory structure 800, the tunnel junction and the antifuse share an interface at middle terminal 42.

Upper and lower interlayer dielectrics (ILD) 12 are seen in FIG. 8A. Formed upon the lower of the two ILDs 12 seen in FIG. 8A is a row conductor 14. Conformally formed over row conductor 14 are an antifuse dielectric 40, a middle terminal 42, and a control element 44. A column conductor 34 is formed upon a fill 30 and upon control element 44. Column conductor 34 is composed of an electrically conductive material that can be the same as the material of which row conductor 14 is composed. Column conductor 34, which can function as a bit line in memory structure 800, can be formed by blanket depositing the electrically conductive material and then patterning the same as shown in FIGS. 8A–8B. After column conductor 34 is defined by patterning, the upper of the two ILDs 12 is formed upon the column conductor 34. Then, memory structure 800 can be formed in a replicating manner so as to construct a series of vertical stacks of memory structure 800, one over another.

Control element 44 will preferably have an equal or lower effective resistance than the antifuse and the fusing voltage thereof will preferably be equal to or greater than that of the antifuse. Row conductor 14 can be composed of aluminum and will be patterned. Antifuse dielectric 40 can be a ceramic material such as alumina and will preferably be unpatterned. Middle terminal 42 will preferably be composed of an unpatterned resistive material, such a doped silicon, and will have a thickness not more than about 1000 Angstroms. Middle terminal 42 is an electrically conductive material between control element 44 and the antifuse. Middle terminal 42 will preferably be unpatterned and have a resistivity that is high enough to minimize current leakage into adjacent memory cells. Control element 44 can be a dielectric material, preferably a ceramic such as alumina, and will also be unpatterned. Column conductor 34 is patterned and can be composed of a conductor such as aluminum. In this embodiment, the antifuse dielectric 40 material has a non-planar top surface and is conformally situated with good step coverage over and between each of the row conductors 14.

To change the breakdown voltage of the antifuse so as to be lower than the breakdown voltage of control element 44, the antifuse can have a composition that is different from that of control element 44. By way of example, control element 44 can be composed of alumina. Alternatively, the surfaces of row conductor 14 or middle terminal 42 can be roughened to make the breakdown voltage lower or to increase the probability of breakdown. In another alternative, control element 44 can be composed of aluminum doped with a small amount of copper, preferably in a range from about 0.5% to about 5%. When so fabricated, the tunnel junction can be more resistant to fusing. Those of skill in the relevant arts will readily recognize that the materials that can be used for the depicted layers of structure 800 can be the same as those of like reference numerals for FIGS. 1A–7B.

Since antifuse structure 700 seen in FIGS. 7A–7B and antifuse structure 800 seen in FIGS. 8A–8B are intended to be fabricated using integrated circuit techniques, it is also intended that the thickness of the antifuse structure will be at current and future minimal design dimensions consistent with ultra high scale integration, such as at or below about 0.18 microns. The implementations disclosed herein for forming a memory structure with antifuse structures can be fabricated using known process equipment in a semiconductor fabrication operation and can allow for a broad range of materials and dimensions for the memory structure. Those of skill in the relevant semiconductor fabrication arts will readily understand the foregoing and other processing operations that can be used to fabricate the disclosed antifuse structures, as well as other memory structures that accomplish the functionality of the disclosed antifuse structures.

Figure 9:
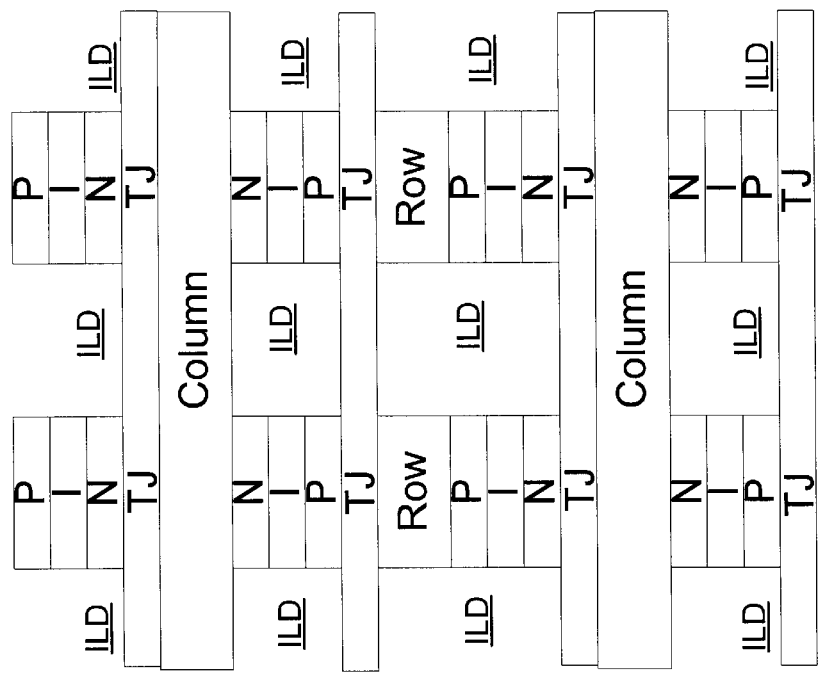
FIG. 9 is a block diagram of a memory structure having a vertically stacked 2N architecture in accordance with an embodiment of the invention.

In one embodiment which can be described as a '2N' architecture, a plurality of antifuse structures, such as those disclosed herein, are stacked one upon the other and are each separated by an interlayer dielectric (ILD) so as to form a plurality of stacked memory cells in a three-dimensional memory structure. By way of example, FIG. 9 shows a plurality of row conductors and column conductors that may be used to make up a three dimensional memory structure having a plurality of memory cells. A PIN diode and a tunnel junction (TJ) are seen in FIG. 9 between vertically adjacent rows and columns. An ILD electrically insulates a row conductor from an vertically adjacent column conductor. In application, the structures that are seen between the upper and lower ILDs 12 seen in FIGS. 7A–7B and 8A–8B would be fabricated so as to be repeated between successive interlayer dielectrics in many vertical stack sequences. A plurality of these vertical stack sequences are contemplated to make a three-dimensional memory structure.

Figure 10:
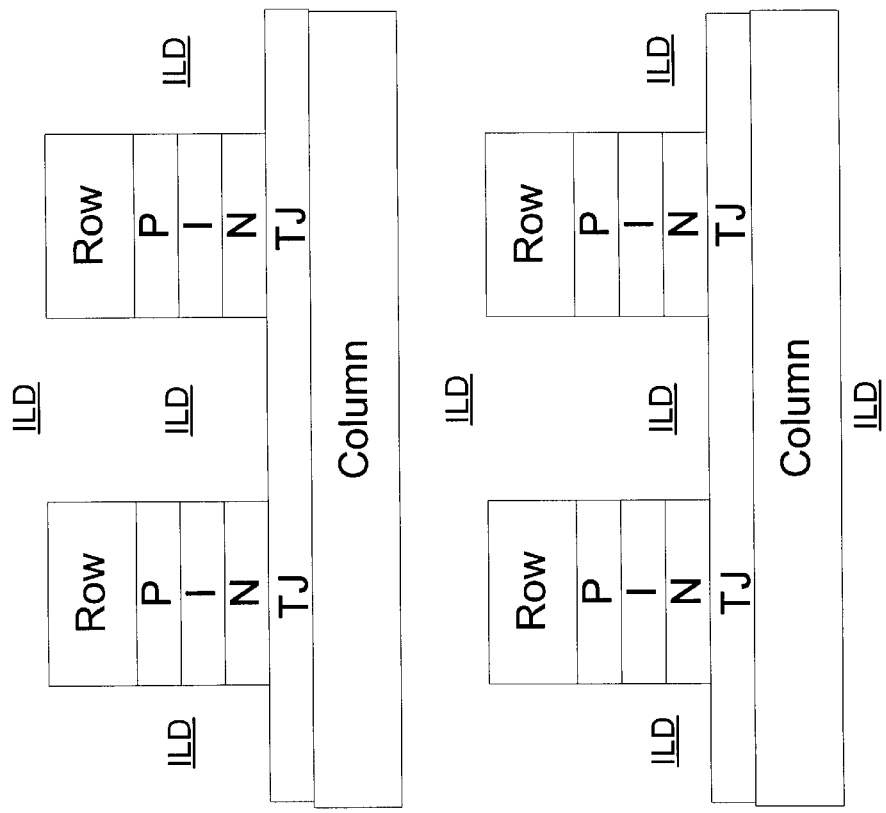
FIG. 10 is a block diagram of a memory structure having a vertically stacked N+1 architecture in accordance with an embodiment of the invention.

In another embodiment which can be described as an 'N+1' architecture, individual adjacent memory cells share row conductors and column conductors. An array of these memory cells are vertically stacked both above and below one other in a three-dimensional memory structure. By way of example, a plurality of row conductors and column conductors, as seen in FIG. 10, may be used to make up a three dimensional memory structure having a plurality of memory cells. Either a PIN diode and a tunnel junction (TJ) or a NIP diode and a TJ, as seen in FIG. 10, can be between vertically adjacent rows and columns. An ILD can be sandwiched between adjacent column conductors to insulate the periphery of the vertically stacked memory cells.

Embodiments of the three dimensional memory structure will preferably be fabricated upon a substrate such as a semiconductor substrate. The term "semiconductor substrate" includes semiconductive material. The term is not limited to bulk semiconductive material, such as a silicon wafer, either alone or in assemblies comprising other materials thereon, and semiconductive material layers, either alone or in assemblies comprising other materials. The term "substrate" refers to any supporting structure including but not limited to the semiconductor substrates described above. A substrate may be made of silicon, glass, gallium arsenide, silicon on sapphire (SOS), epitaxial formations, germanium, germanium silicon, diamond, silicon on insulator (SOI) material, selective implantation of oxygen (SIMOX) substrates, and/or like substrate materials. Preferably, the substrate is made of silicon, which is typically single crystalline.

It should be recognized that, in addition to the memory structure embodiments decribed above, this invention is also applicable to alternative antifuse technologies including memory devices for IC chips such as field programmable gate arrays (FPGAs), programmable read-only memories (PROMs) and the like.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claim are to be embraced within their scope.

What is claimed is:

1. A memory structure, comprising:
   a plurality of control elements;
   a plurality of antifuse electrode pairs forming a plurality of row conductors and a plurality of middle conductors in electrical communication with the plurality of control elements and
   an antifuse material continuously unpatterned and sandwiched between each of the plurality of antifuse electrode pairs wherein the antifuse material has a non-planar top surface and is conformally situated with good step coverage over each of the row conductors in said plurality of row conductors.

2. A memory structure, comprising:
   a plurality of control elements;
   a plurality of antifuse structures each having an antifuse electrode pair containing at least one first conductor and at least one second conductor, the antifuse electrode pair electrically-insulated by a common and continuous antifuse layer wherein each the antifuse structures has a non-planar top surface and is conformally situated with good step coverage over each first conductor contacting the respective antifuse structure, and wherein each second conductor is in electrical communication with one of the plurality of control elements.

3. The memory structure as defined in claim 2, further comprising:
   a dielectric layer disposed over the common and continuous antifuse layer and contacting one antifuse electrode in each said pair;
   at least one third conductor disposed over the dielectric layer; and
   the at least one first conductor functioning as the other antifuse electrode in each said pair.

4. A memory structure, comprising:
   a plurality of stacked layers each being separated from adjacent stacked layers by an interlayer dielectric, wherein each stacked layer include a pair of antifuse electrodes and a plurality of tunnel junction control elements in electrical communication with one of the pair of antifuse electrodes; and
   an antifuse material extending continuously between the pairs of antifuse electrodes of each of the stacked layers.

5. A memory structure on a substrate, comprising:
   a plurality of stacked layers each including:
      an interlayer dielectric that extends continuously across the substrate;
      an antifuse material that further extends continuously across the substrate over the interlayer dielectric;
      a plurality of antifuse electrodes each having one said antifuse electrode separated from the other pair by the antifuse material; and
      a plurality of tunnel junction control elements in electrical communication with one of the pair of antifuse electrodes.

6. The memory structure as defined in claim 5, wherein the interlayer dielectric of each said plurality of stacked layers separates one stacked layer from an adjacent stacked layer.

7. A memory structure comprising a plurality of word lines disposed next to a continuous antifuse layer which is disposed next to a column line in electrical communication with a plurality of tunnel junction control elements, wherein each tunnel junction control element is physically separated from a respective word line by the continuous antifuse layer.

8. A memory structure, comprising:
a plurality of row conductors;
a continuous blanket of antifuse material disposed upon the plurality of row conductors;
at least one tunnel junction control element substantially aligned over each said row conductor and separated therefrom by the antifuse material; and
a column conductor aligned over each at least one tunnel junction control element.

9. The memory structure as defined in claim 8, wherein:
each said row conductor, each said tunnel junction control element, and each said column conductor is included in an individual memory cell;
each said individual memory cell is vertically stacked with another said memory cell; and
each said individual memory cell shares one of the row and column conductors thereof with another said memory cell that is vertically adjacent thereto.

10. A memory structure, comprising:
a plurality of row conductors;
a continuous blanket of antifuse material disposed upon the plurality of row conductors;
at least one control element substantially aligned over each said row conductor and separated therefrom by the antifuse material; and
a column conductor aligned over each at least one control element;
wherein the antifuse material has a non-planar top surface and is conformally situated with good step coverage over and between each of the row conductors in said plurality of row conductors.

11. A memory structure, comprising:
a plurality of row conductors;
a continuous blanket of antifuse material disposed upon the plurality of row conductors;
at least one control element substantially aligned over each said row conductor and separated therefrom by the antifuse material; and
a column conductor aligned over each at least one control element;
a first diffusion barrier upon the antifuse material that is upon each of the row conductors;
an interface metal between the first diffusion barrier and each at least one control element; and
a second diffusion barrier between each at least one control element and the respective column conductor.

12. A memory structure in an integrated circuit, comprising:
an interlayer dielectric;
an electrically conductive row conductor over the interlayer dielectric;
an unpatterned antifuse material over the row conductor, wherein the unpatterned antifuse material has a non-planar top surface and is conformally situated with good step coverage over the row conductor;
an electrically conductive column conductor; and
a plurality of control elements between the row and column conductors each being separated from the row conductor by the unpatterned antifuse material.

13. A memory structure, comprising:
a tunnel junction control element; and
an antifuse in electrical communication with the tunnel junction control element.

14. The memory structure as defined in claim 13, wherein:
the tunnel junction control element comprises an electrical insulator between a column conductor and an electrically resistive material; and
the antifuse comprises:
a row conductor;
an antifuse dielectric upon the row conductor; and
the electrically resistive material.

15. The memory structure as defined in claim 14, further comprising a plurality of vertically stacked pairs of said tunnel junction control element and said antifuse, wherein the row and column conductors in each said pair are shared with another said pair that is vertically adjacent thereto.

16. The memory structure as defined in claim 14, wherein the electrical insulator of the tunnel junction control element has:
an effective resistance not greater than that of the antifuse; and
a fusing voltage greater than or equal to that of the antifuse.

17. The memory structure as defined in claim 14, wherein each of the following is unpatterned:
the antifuse dielectric;
the electrically resistive material; and
the electrical insulator of the tunnel junction control element.

18. The memory structure as defined in claim 14, wherein:
the row conductor comprises aluminum;
the antifuse dielectric comprises alumina;
the electrically resistive material of the tunnel junction control element comprises doped silicon; and
the electrical insulator of the tunnel junction control element comprises alumina.

* * * * *